(12) United States Patent
Matsui et al.

(10) Patent No.: US 8,754,433 B2
(45) Date of Patent: Jun. 17, 2014

(54) SEMICONDUCTOR DEVICE AND METHOD OF MANUFACTURING THE SAME

(71) Applicant: Kabushiki Kaisha Toshiba, Tokyo (JP)

(72) Inventors: Yukiteru Matsui, Yokohama (JP); Gaku Minamihaba, Yokohama (JP); Hajime Eda, Kawasaki (JP); Masayoshi Iwayama, Yokohama (JP); Minoru Amano, Sagamihara (JP); Masatoshi Yoshikawa, Yokohama (JP); Motoyuki Sato, Yokohama (JP); Kyoichi Suguro, Yokohama (JP); Masako Kodera, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 13/708,798

(22) Filed: Dec. 7, 2012

(65) Prior Publication Data

US 2013/0095656 A1    Apr. 18, 2013

Related U.S. Application Data

(62) Division of application No. 13/035,546, filed on Feb. 25, 2011, now abandoned.

(30) Foreign Application Priority Data

May 28, 2010 (JP) .................... 2010-123531
Oct. 29, 2010 (JP) .................... 2010-243821

(51) Int. Cl.
     *H01L 33/00* (2010.01)
(52) U.S. Cl.
     USPC .......................................... 257/98
(58) Field of Classification Search
     CPC ............ H01L 21/3212; H01L 21/7684; H01L 21/76877
     USPC .............. 257/664–677, 734–786,
     257/E21.537–E21.539, E29.111–E29.165,
     257/E23.01–E23.079, E23.141–E23.179,
     257/E29.116–E29.122, E29.284, E29.299,
     257/E21.432, E21.135–E21.21, E21.627,
     257/E21.641, E21.44, E21.619–E21.62,
     257/E21.575–E21.597, 41, 81, 82, 91, 99,
     257/177–182, 276, 457, 459, 502, 503, 573,
     257/284, 621, 688–700, 734–786,
     257/E23.01–E23.079, E23.141–E23.179,
     257/295, 421, E29.167, E29.272, E29.323,
     257/E21.436, E21.663–E21.665, E27.104,
     257/296–313, 533, 595–602, 923–924,
     257/E27.016–E27.017, E27.019–E27.021,
     257/E27.023–E27.025, E27.03–E27.035,
     257/E27.037–E27.038, E27.041–E27.045,
     257/E27.047–E27.048;
     257/E27.071–E27.09, E27.092,
     257/E27.093, E27.095, E27.101,
     257/E27.114–E27.116; 438/171, 190, 210,
     438/238–253, 329, 379, 387, 444, 901
     See application file for complete search history.

(56) References Cited

U.S. PATENT DOCUMENTS 5,726,099 A  *  3/1998  Jaso ........................ 438/693
6,461,230 B1 * 10/2002  Tsai et al. ................ 451/57

(Continued)

FOREIGN PATENT DOCUMENTS

| JP | 2003-086772 A | 3/2003 |
| JP | 2003-218324 A | 7/2003 |

(Continued)

OTHER PUBLICATIONS

Japanese Office Action for corresponding Japanese Application No. 2010-243821, dated Apr. 17, 2012, in 5 pages.

(Continued)

*Primary Examiner* — Dao H Nguyen
*Assistant Examiner* — Tram H Nguyen
(74) *Attorney, Agent, or Firm* — Knobbe, Martens, Olson & Bear LLP

(57) ABSTRACT

According to one embodiment, a semiconductor device includes a switch element provided in a surface area of a semiconductor substrate, a contact plug with an upper surface and a lower surface, and a function element provided on the upper surface of the contact plug. The lower surface of the contact plug is connected to the switch element. The upper surface of the contact plug has a maximum roughness of 0.2 nm or less.

8 Claims, 15 Drawing Sheets

(56) References Cited

U.S. PATENT DOCUMENTS

| | | | |
|---|---|---|---|
| 6,727,170 B2 * | 4/2004 | Takata et al. | 438/622 |
| 7,566,888 B2 * | 7/2009 | Swenson | 250/492.3 |
| 2001/0006841 A1 * | 7/2001 | Tsuchiya et al. | 438/584 |
| 2004/0115839 A1 | 6/2004 | Sugita et al. | |
| 2006/0030243 A1 | 2/2006 | Nishimoto et al. | |
| 2007/0018332 A1 * | 1/2007 | Ueno | 257/774 |
| 2007/0190744 A1 * | 8/2007 | Hiraiwa et al. | 438/424 |
| 2007/0246787 A1 * | 10/2007 | Wang et al. | 257/421 |
| 2008/0062582 A1 | 3/2008 | Komagaki | |
| 2009/0256220 A1 | 10/2009 | Horng et al. | |
| 2010/0075501 A1 | 3/2010 | Abe et al. | |
| 2010/0127316 A1 * | 5/2010 | Tu et al. | 257/296 |
| 2010/0157664 A1 | 6/2010 | Chung | |
| 2011/0294291 A1 | 12/2011 | Matsui et al. | |

FOREIGN PATENT DOCUMENTS

| | | |
|---|---|---|
| JP | 2004-118954 A | 4/2004 |
| JP | 2007-149778 A | 6/2007 |
| JP | 2007-331105 A | 12/2007 |
| JP | 2008-066612 A | 3/2008 |
| JP | 2009-531865 A | 9/2009 |
| JP | 2010-073953 A | 4/2010 |
| WO | WO 2007/117392 | 10/2007 |

OTHER PUBLICATIONS

Japanese Office Action for corresponding Japanese Application No. 2010-243821, mailed Jul. 24, 2012, in 2 pages.

Toshiba, Background Art Information, Aug. 25, 2010.

* cited by examiner

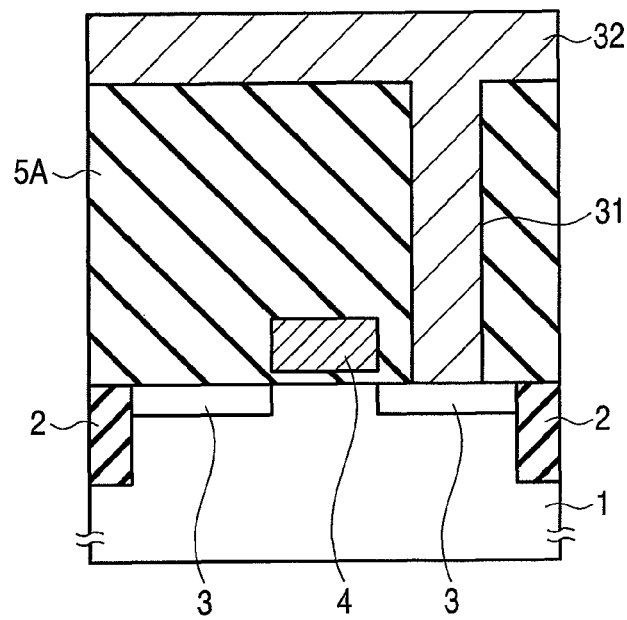
F I G. 3
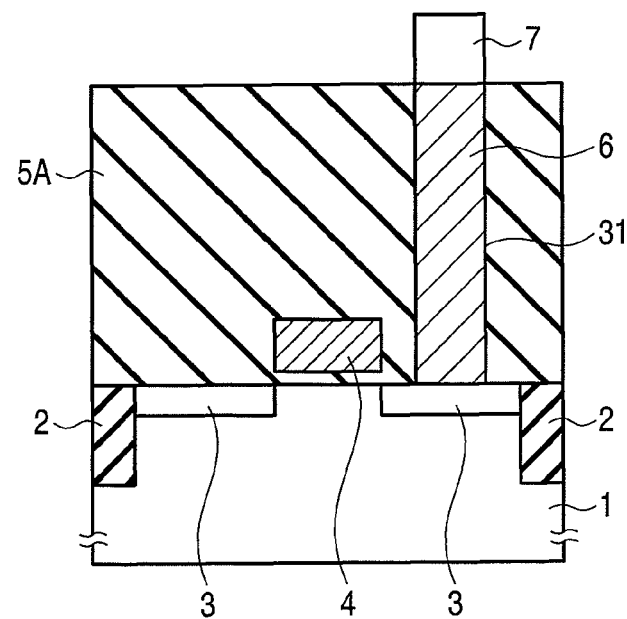
F I G. 4

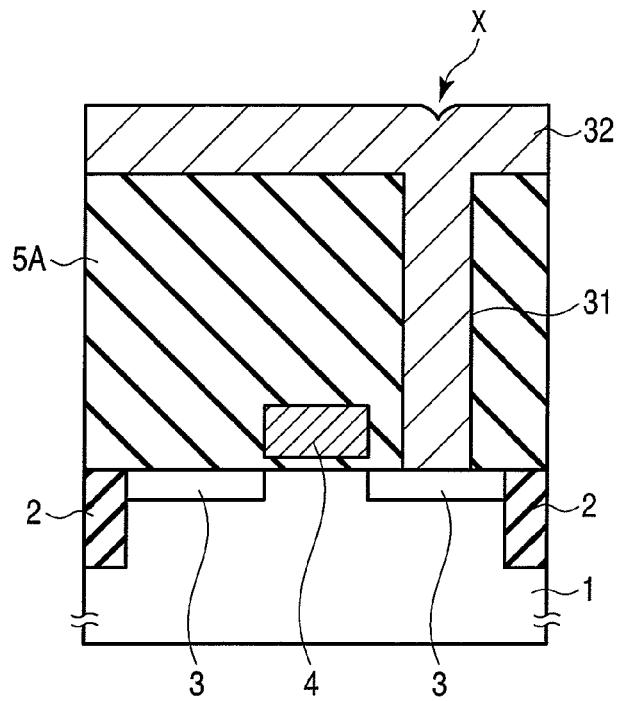
F I G. 5
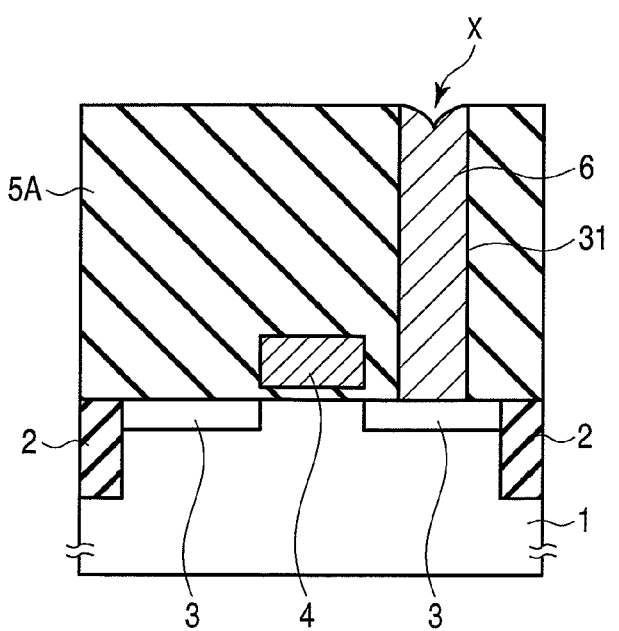
F I G. 6

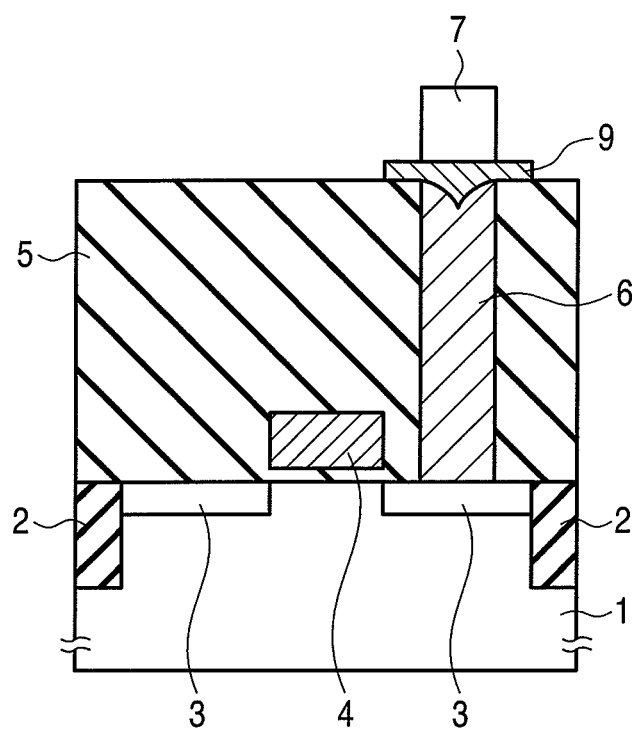
F I G. 11

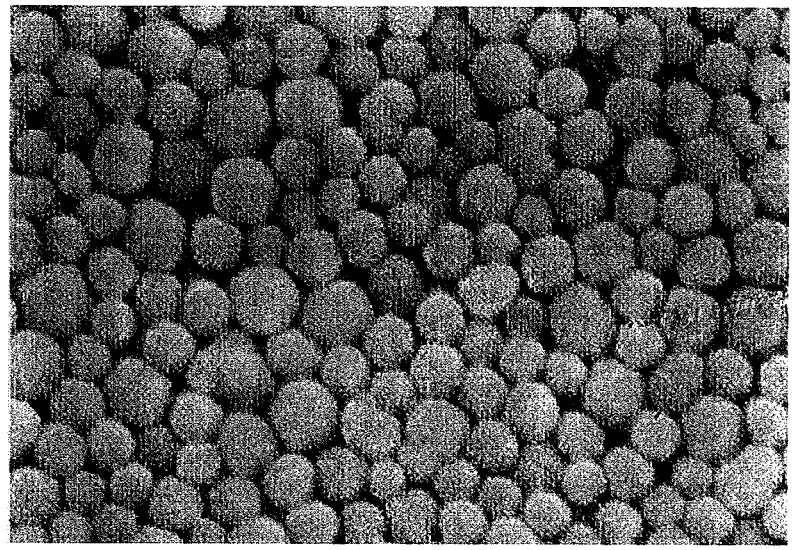
F I G. 13
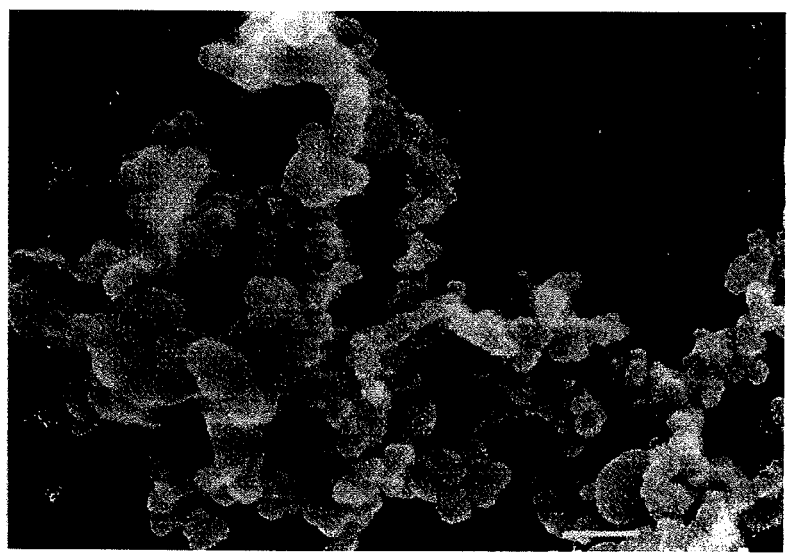
F I G. 14

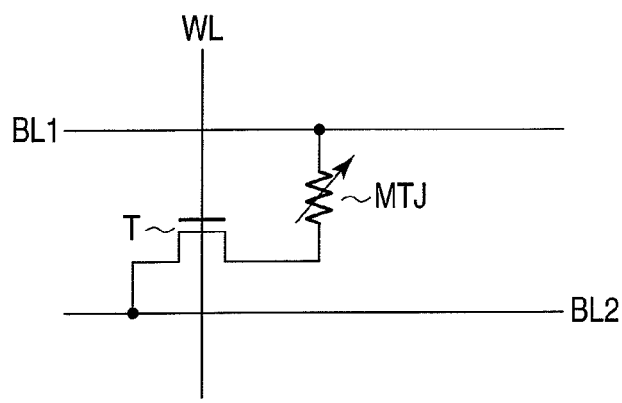
F I G. 17
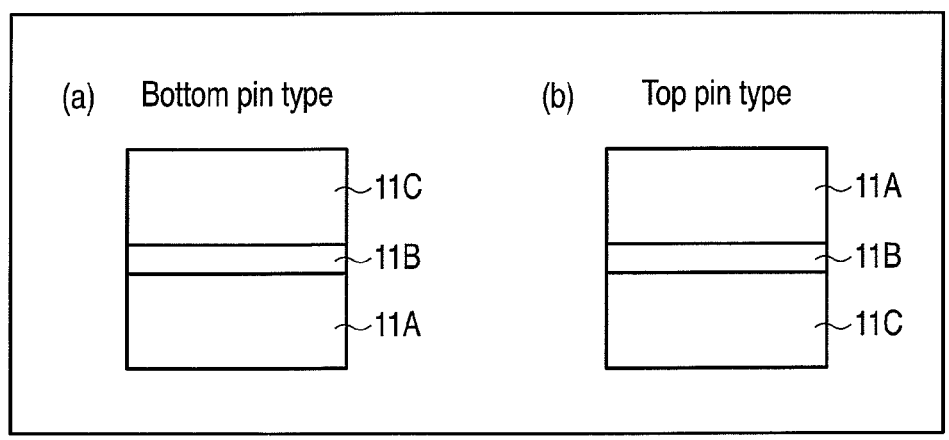
F I G. 18

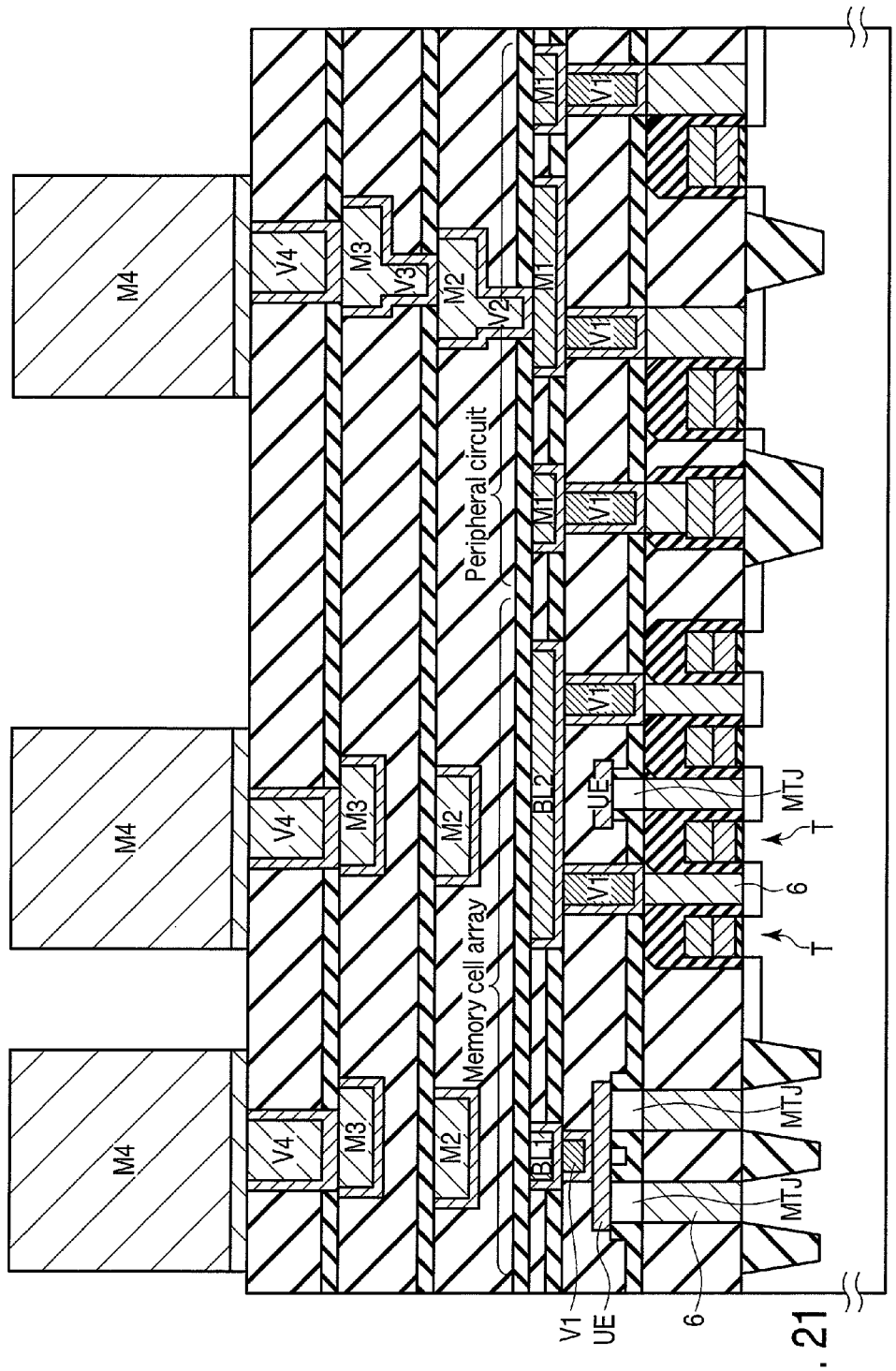
F I G. 21

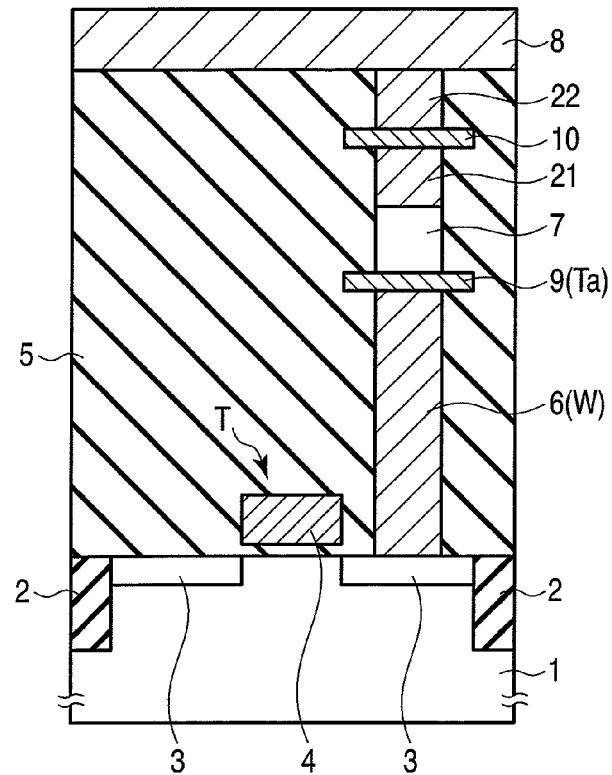
F I G. 22
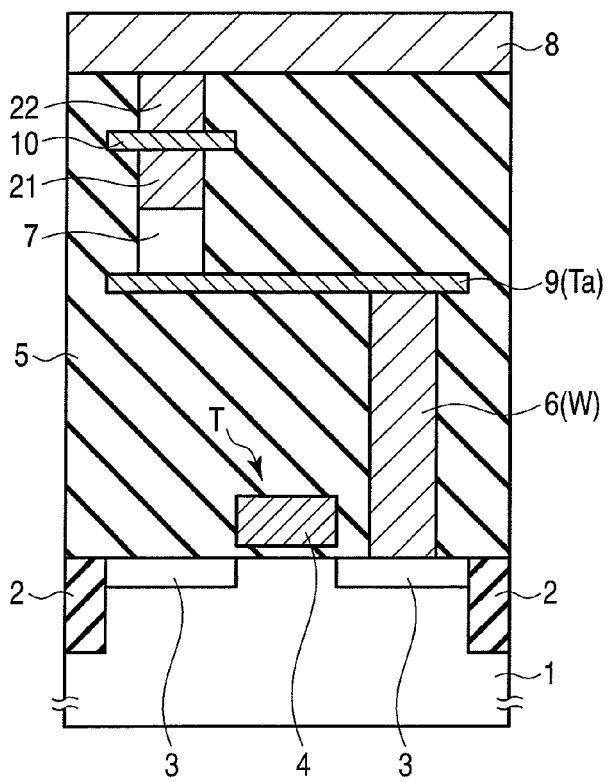
F I G. 23

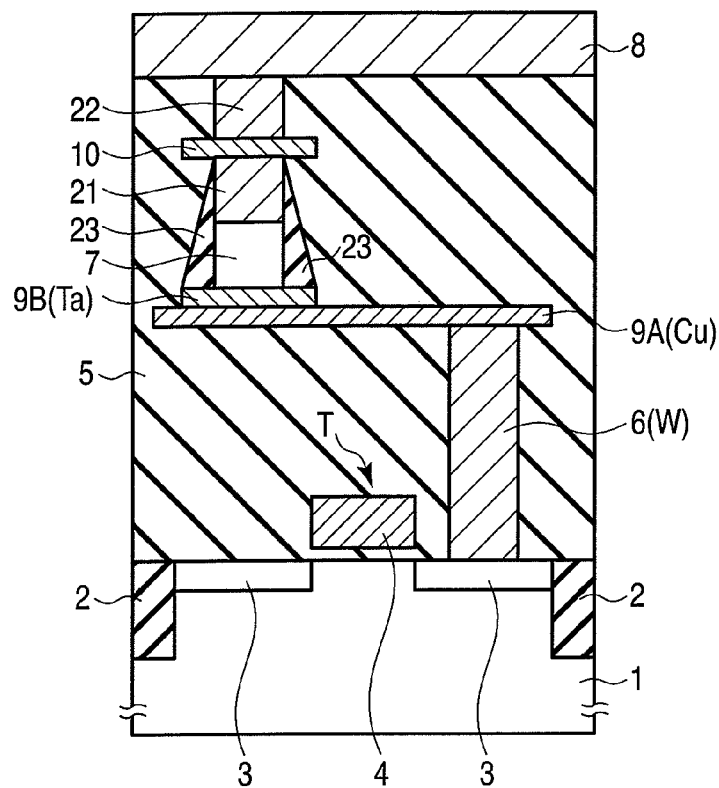
F I G. 25
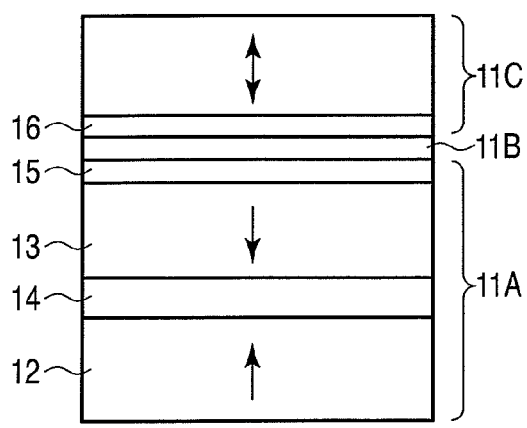
F I G. 26

SEMICONDUCTOR DEVICE AND METHOD OF MANUFACTURING THE SAME

CROSS-REFERENCE TO RELATED APPLICATIONS

This application is a divisional of U.S. patent application Ser. No. 13/035,546 filed on Feb. 25, 2011, which is based upon and claims the benefit of priority from Japanese Patent Applications No. 2010-123531, filed May 28, 2010, and No. 2010-243821, filed Oct. 29, 2010; the entire contents of these applications are incorporated herein by reference.

FIELD

Embodiments described herein relate generally to a semiconductor device and a method of manufacturing the same.

BACKGROUND

Recently, a structure in which a functional element having a particular function is disposed on the top of a semiconductor substrate has been used to enhance integration of a semiconductor integrated circuit. However, the disadvantage of using this structure is that characteristics of the functional element deteriorate if a foundation of the functional element is not planarized.

A magnetic random access memory is described as one such example.

In the magnetic random access memory, for example, one memory cell comprises a switching element (e.g., a field-effect transistor [FET]) disposed on a surface region of a semiconductor substrate, and a magnetoresistive element disposed on the top of the switching element.

The basic structure of the magnetoresistive element is a stack structure comprising a magnetic free layer having a variable magnetization, a magnetic pinned layer having an invariable magnetization, and a tunnel barrier layer disposed therebetween.

In such a magnetic random access memory, uniform thickness of the tunnel barrier layer and uniform quality of a material constituting this layer are indispensable to the improvement of the magnetic property of the magnetoresistive element. However, since the tunnel barrier layer is extremely thin (10 nm or less), the formation state of this extremely thin film deteriorates and the thickness of the tunnel barrier layer and the quality of the material constituting this layer cannot be uniform if the foundation of the tunnel barrier layer is not planar. As a result, the magnetic property of the magnetoresistive element cannot be improved.

To address such a problem, there has been suggested a technique for polishing a ferromagnetic (magnetic pinned) or antiferromagnetic layer serving as the foundation of the tunnel barrier layer so that its maximum roughness may be 0.5 nm or less.

However, according to this technique, a surface of the ferromagnetic or antiferromagnetic layer is directly polished. Thus, the ferromagnetic or antiferromagnetic layer is damaged by stress during the polishing, and the magnetic property of the magnetoresistive element deteriorates. Moreover, the ferromagnetic or antiferromagnetic layer varies in thickness, which leads to the variation of the magnetic property of the magnetoresistive element.

Furthermore, according to this technique, the magnetoresistive element (magnetic free layer/tunnel barrier layer/magnetic pinned layer) is not disposed immediately on a contact plug. The reason is that a magnetic field is used to write into the magnetoresistive element, so that if the magnetoresistive element is disposed immediately on the contact plug, it is difficult to apply the magnetic field to the magnetoresistive element.

Therefore, according to this technique, integration of the semiconductor integrated circuit cannot be enhanced by the size reduction of the memory cell.

BRIEF DESCRIPTION OF THE DRAWINGS

FIGS. 3 and 4 show a first embodiment of a manufacturing method.
FIGS. 5 to 8 show a second embodiment of a manufacturing method.
FIGS. 9 to 11 show a third embodiment of a manufacturing method.
FIG. 13 shows colloidal silica.
FIG. 14 shows fumed silica.
FIG. 17 shows an equivalent circuit of a MRAM-cell.
FIG. 18 shows a variation of a magnetoresistive element.
FIG. 21 shows a detail of MRAM.
FIGS. 22 to 25 show an application example of the semiconductor device.
FIG. 26 shows an application example of the magnetoresistive element.

DETAILED DESCRIPTION

In general, according to one embodiment, a semiconductor device comprising: a switch element provided in a surface area of a semiconductor substrate; a contact plug with an upper surface and a lower surface, the lower surface connected to the switch element, the upper surface having a maximum roughness of 0.2 nm or less; and a function element provided on the upper surface of the contact plug.

A method of manufacturing the semiconductor device, wherein the contact plug is formed by a first step in which a first metal material is polished by a CMP-process after the first metal material is formed, and the CMP-process is executed by using an acid-slurry including a colloidal silica.

1. Basic Structure

Figure 1:
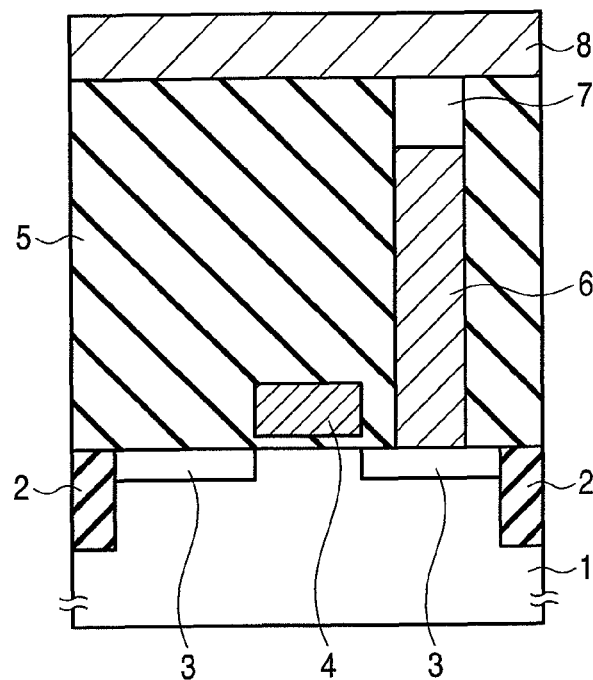
FIGS. 1 and 2 show an embodiment of a semiconductor device.
Figure 2:
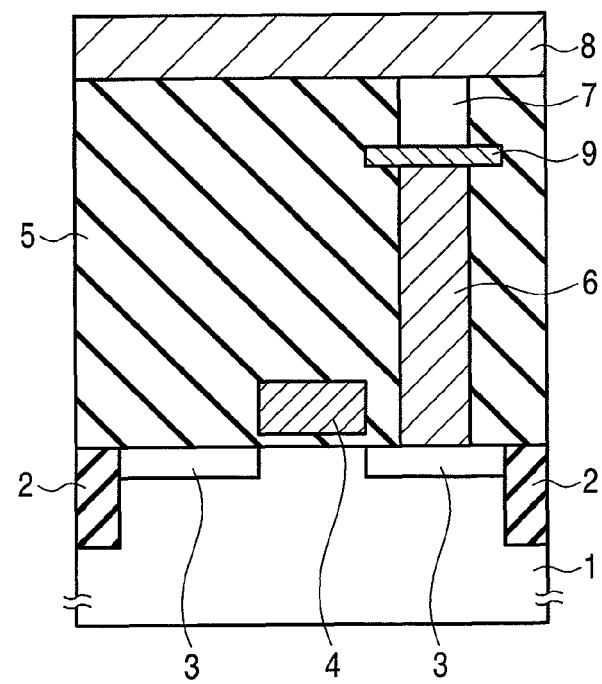

FIG. 1 and FIG. 2 show a basic structure of a semiconductor device.

Semiconductor substrate 1 is, for example, a silicon substrate, and its conductivity type may be either P or N. For example, a silicon oxide layer having a shallow trench isolation (STI) structure is disposed in semiconductor substrate 1 as element isolation insulating layer 2.

A switching element is disposed in a surface region of semiconductor substrate 1, specifically, in an element region (active area) surrounded by element isolation insulating layer 2. In this example, the switching element is a field-effect transistor (FET), and includes two source/drain diffusion layers 3 in semiconductor substrate 1, and gate electrode 4 disposed on a channel region between the source/drain diffusion layers via a gate insulating film.

The switching element is covered with insulating film (e.g., silicon oxide) 5. A contact hole is provided in insulating film 5. Contact plug 6 is disposed in the contact hole. Contact plug 6 comprises a metal material such as tungsten (W) or copper (Cu).

A lower surface of contact plug 6 is connected to the switching element. In this example, contact plug 6 is in direct contact with source/drain diffusion layer 3. However, between contact plug 6 and source/drain diffusion layer 3, a different component such as a conductive layer may be present.

Functional element 7 having a particular function is disposed immediately on an upper surface of contact plug 6. Functional element 7 is an element having a particular function, such as a magnetoresistive element, variable resistive element (metal oxide), phase change element, diode, resistive element or capacity element. Functional element 7 may be in direct contact with contact plug 6 as shown in FIG. 1, or may be disposed immediately above contact plug 6 via lower electrode 9 as shown in FIG. 2.

A maximum roughness of the upper surface of contact plug 6 serving as a foundation of functional element 7 is 0.2 nm or less.

Furthermore, interconnect 8 is connected to functional element 7.

According to the basic structure described above, integration of a semiconductor integrated circuit and performance of the functional element can be enhanced at the same time.

2. Manufacturing Method

An example of a manufacturing method for obtaining such a basic structure is described.

(1) First Embodiment

FIG. 3 and FIG. 4 show a first embodiment.

First, as shown in FIG. 3, element isolation insulating layer 2 is formed in semiconductor substrate 1. Element isolation insulating layer 2 is formed by, for example, a combination of chemical vapor deposition (CVD), photolithography, reactive ion etching (RIE) and chemical mechanical polishing (CMP).

An FET having source/drain diffusion layers 3 and gate electrode 4 is formed as a switching element in an element region surrounded by element isolation insulating layer 2.

Insulating layer (e.g., silicon oxide) 5A covering the switching element is then formed by the CVD. Further, contact hole 31 which has a diameter of about 40 nm and which reaches source/drain diffusion layer 3 is formed in insulating layer 5A by the photolithography and RIE.

Furthermore, metal material 32 to fill contact hole 31 is formed on insulating layer 5A by the CVD. Metal material 32 may be one material or a combination of materials (e.g., a stack of W/a barrier metal).

Moreover, metal material 32 is polished by the CMP that uses an acid-slurry including colloidal silica so that metal material 32 may remain in contact hole 31 alone.

Conditions of this CMP are, for example, as follows:
First CMP
Polishing pad: IC1000/S400 (manufactured by Rohm and Haas Corporation)
Slurry: alumina (0.5 wt %)+iron nitrate (1.0 wt %), pH=1.5
Second CMP (Touchup CMP)
Polishing pad: Politex (manufactured by Rohm and Haas Corporation)
Slurry: colloidal silica (particle diameter 45 nm, 5 wt %+particle diameter 80 nm, 1 wt %)+ammonium persulfate (1.0 wt %+pH adjuster), pH=2.0

As a result of this CMP, contact plug 6 having a planarized upper surface is formed in contact hole 31, as shown in FIG. 4. In forming contact plug 6, the upper surface of contact plug 6 is overetched to a position lower than the upper surface of insulating layer 5A so that contact plug 6 may remain completely in contact hole 31 alone.

Thus, after the above-mentioned CMP is finished, the upper surface of contact plug 6 is melted into a dished form. Hereinafter, the state of the upper surface of contact plug 6 which includes this recess is expressed by the term "flatness", and the state of the upper surface of contact plug 6 which does not include this recess is expressed by the term "smoothness".

It should be noted that the smoothness is synonymous with the maximum roughness.

When the flatness and smoothness (maximum roughness) of the upper surface of contact plug 6 after touchup CMP are evaluated by an atomic force microscope (AFM), the flatness is 20 nm or less, and the smoothness is 0.20 nm or less.

Furthermore, in order to improve the flatness and smoothness of the upper surface of contact plug 6, the upper surface of contact plug 6 may be smoothed by a gas cluster ion beam method after the touchup CMP.

The gas cluster ion beam method is characterized by being free of scratches and residual abrasive grains that are problems of the CMP and by the high anisotropy of a surface to be smoothed. However, this method is effective in smoothing a step of several tens of nanometers or less and is not suited to smoothing of a step greater than this size.

Thus, it is desirable to perform smoothing by the gas cluster ion beam method after the touchup CMP as described above.

When the smoothing is performed by the gas cluster ion beam method, the touchup CMP does not have to be CMP that uses the acid-slurry including colloidal silica. Moreover, the touchup CMP (second time) may be omitted.

Furthermore, as shown in FIG. 4, functional element 7 is formed immediately on the upper surface of contact plug 6. Since this functional element 7 is formed on the upper surface of contact plug 6 that has been planarized as described above, integration of the semiconductor integrated circuit and performance of the functional element can be enhanced at the same time.

Finally, functional element 7 is covered with an insulating layer, and an interconnect connected to functional element 7 is formed, such that the basic structure shown in FIG. 1 is completed.

Thus, as a condition of the CMP for forming the contact plug, the acid-slurry including colloidal silica that has a small particle diameter is used. Consequently, both the flatness and smoothness of the upper surface of the contact plug can be sufficiently low.

In addition, colloidal silica is an assembly of independent silica particles as shown in FIG. 13. The diameter of each silica particle is preferably 100 nm or less.

Furthermore, if smoothing by the gas cluster ion beam method is performed after the CMP, the flatness and smoothness of the upper surface of the contact plug can be further improved.

(2) Second Embodiment

FIG. 5 to FIG. 8 show a second embodiment.

The second embodiment provides an improved process of the first embodiment.

When a contact hole is filled with a metal material, a seam is formed in a surface of the metal material immediately on the contact hole. This seam remains in an upper surface of a contact plug even after the CMP is performed.

The second embodiment concerns a technique for improving the flatness and smoothness of the upper surface of the contact plug affected by the seam.

First, as shown in FIG. 5, element isolation insulating layer 2 is formed in semiconductor substrate 1. Element isolation insulating layer 2 is formed by, for example, a combination of the CVD, photolithography, RIE and CMP.

An FET having source/drain diffusion layers 3 and gate electrode 4 is formed as a switching element in an element region surrounded by element isolation insulating layer 2.

Insulating layer (e.g., silicon oxide) 5A covering the switching element is then formed by the CVD. Further, contact hole 31 which has a diameter of about 40 nm and which reaches source/drain diffusion layer 3 is formed in insulating layer 5A by the photolithography and RIE.

Furthermore, metal material 32 to fill contact hole 31 is formed on insulating layer 5A by the CVD. As contact hole 31 has a high aspect ratio, seam X is formed in a surface of metal material 32 immediately on contact hole 31. Metal material 32 may be one material or a combination of materials (e.g., a stack of W/a barrier metal).

Moreover, metal material 32 is polished by the CMP that uses an acid-slurry including colloidal silica so that metal material 32 may remain in contact hole 31 alone. Conditions of this CMP are the same as those in the first embodiment and are therefore not described here.

As a result of this CMP, contact plug 6 having a planarized upper surface is formed in contact hole 31, as shown in FIG. 6. However, seam X remains in the upper surface of the contact plug even after the CMP.

Thus, the formation of metal material 32 and the CMP are repeated twice or more.

In the example described, the formation of metal material 32 and the CMP are again performed once (twice in total).

Figure 7:
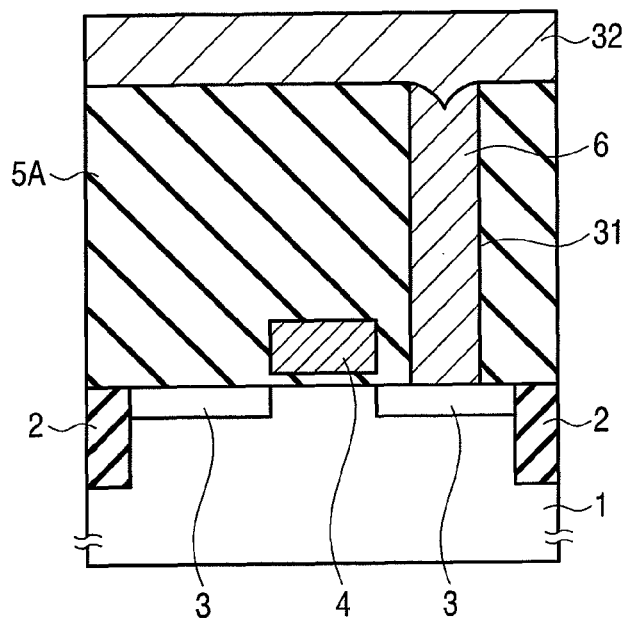

That is, as shown in FIG. 7, metal material 32 is again formed on insulating layer 5A and on contact plug 6 by the CVD. Here, the seam remains in the upper surface of contact plug 6. However, this seam is sufficiently shallow in comparison with contact hole 31. Therefore, when the seam is filled with metal material 32, no seam is again formed in the surface of metal material 32 immediately on contact hole 31.

It should be noted here that even when metal material 32 includes a combination of materials (e.g., a stack of W/a barrier metal) in an initial (first) step (metal material 32 formation and CMP), metal material 32 includes one material (e.g., the same material as that of an uppermost layer in the initial step; W) in subsequent (second and subsequent) steps (metal material 32 formation and CMP).

Moreover, when metal material 32 includes one material in the initial (first) step, metal material 32 includes, in subsequent (second and subsequent) steps, the same material as that of metal material 32 in the initial step.

Moreover, metal material 32 is polished by the CMP that uses an acid-slurry including colloidal silica so that metal material 32 may remain in contact hole 31 alone. Conditions of this CMP are the same as those in the first embodiment and are therefore not described here.

Figure 8:
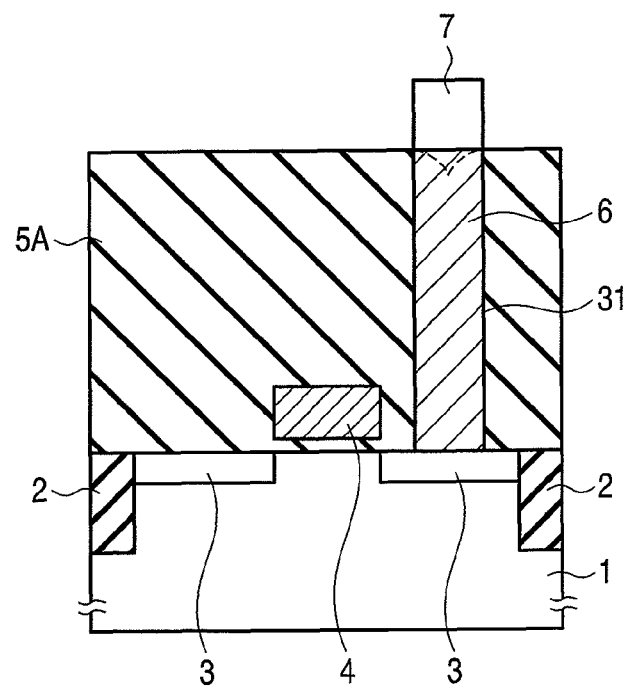

As a result of this CMP, the seam disappears, and contact plug 6 having a planarized upper surface is formed in contact hole 31, as shown in FIG. 8.

When the flatness and smoothness (maximum roughness) of the upper surface of contact plug 6 after touchup CMP are evaluated by the AFM, the flatness is 15 nm or less, and the smoothness is 0.15 nm or less.

Furthermore, in order to improve the flatness and smoothness of the upper surface of contact plug 6, the upper surface of contact plug 6 may be smoothed by the gas cluster ion beam method after the touchup CMP as in the first embodiment.

For the smoothing by the gas cluster ion beam method, the touchup CMP does not have to be the CMP that uses the acid-slurry including colloidal silica. Moreover, the touchup CMP (second time) may be omitted.

Furthermore, as shown in FIG. 8, functional element 7 is formed immediately on the upper surface of contact plug 6. Since this functional element 7 is formed on the upper surface of contact plug 6 that has been planarized as described above, integration of the semiconductor integrated circuit and performance of the functional element can be enhanced at the same time.

Finally, functional element 7 is covered with an insulating layer, and an interconnect connected to functional element 7 is formed, such that the basic structure shown in FIG. 1 is completed.

Thus, as a condition of the CMP for forming the contact plug, the acid-slurry including colloidal silica that has a small particle diameter is used, and the formation of the metal material and the CMP are repeated twice or more. Consequently, both the flatness and smoothness of the upper surface of the contact plug can be sufficiently low.

In addition, the particle diameter of colloidal silica is preferably 100 nm or less as in the first embodiment.

If the smoothing by the gas cluster ion beam method is performed after the CMP, the flatness and smoothness of the upper surface of the contact plug can be further improved.

(3) Third Embodiment

Figure 9:
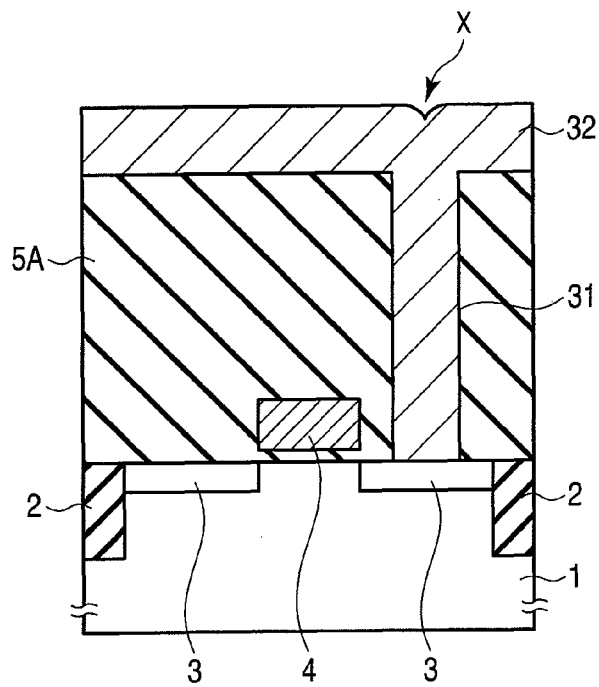
Figure 10:
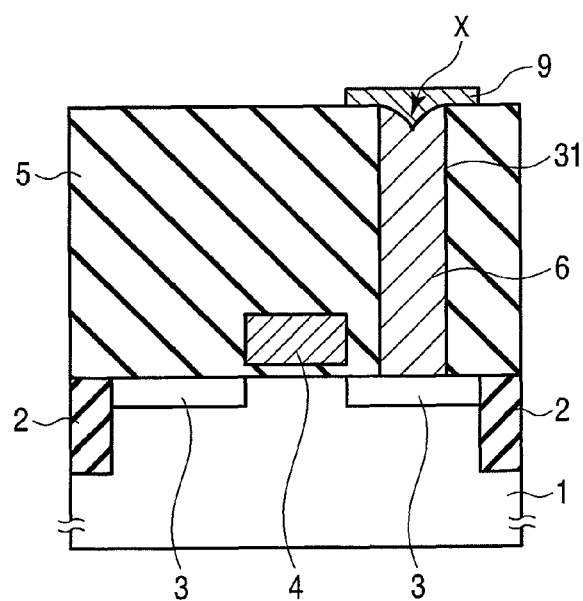

FIG. 9 to FIG. 11 show a third embodiment.

The third embodiment also provides an improved process of the first embodiment, and concerns a technique for improving the flatness and smoothness of an upper surface of a contact plug affected by a seam.

First, as shown in FIG. 9, element isolation insulating layer 2 is formed in semiconductor substrate 1. Element isolation insulating layer 2 is formed by, for example, a combination of the CVD, photolithography, RIE and CMP.

An FET having source/drain diffusion layers 3 and gate electrode 4 is formed as a switching element in an element region surrounded by element isolation insulating layer 2.

Insulating layer (e.g., silicon oxide) 5A covering the switching element is then formed by the CVD. Further, contact hole 31 which has a diameter of about 40 nm and which reaches source/drain diffusion layer 3 is formed in insulating layer 5A by the photolithography and RIE.

Furthermore, metal material 32 to fill contact hole 31 is formed on insulating layer 5A by the CVD. As contact hole 31 has a high aspect ratio, seam X is formed in a surface of metal material 32 immediately on contact hole 31. Metal material 32 may be one material or a combination of materials (e.g., a stack of W/a barrier metal).

Moreover, metal material 32 is polished by the CMP that uses an acid-slurry including colloidal silica so that metal material 32 may remain in contact hole 31 alone. Conditions of this CMP are the same as those in the first embodiment and are therefore not described here.

As a result of this CMP, contact plug 6 having a planarized upper surface is formed in contact hole 31, as shown in FIG. 10. However, seam X remains in the upper surface of the contact plug even after the CMP.

Thus, lower electrode 9 is formed on contact plug 6.

That is, a metal material to fill seam X in contact plug 6 is formed on insulating layer 5A by the CVD. This metal material includes, for example, a material (e.g., Ta) different from the material of contact plug 6. Here, seam X remains in the upper surface of contact plug 6. However, seam X is sufficiently shallow in comparison with contact hole 31. Therefore, when seam X is filled with the metal material, no seam is again formed in the surface of the metal material immediately on contact plug 6.

Moreover, the metal material is polished by the CMP that uses a slurry including colloidal silica. Conditions of this CMP are, for example, as follows:

Polishing pad: IC1000/S400 (manufactured by Rohm and Haas Corporation)

Slurry: colloidal silica (particle diameter 25 nm, 5 wt %)+hydrogen peroxide solution (0.1 wt % organic acid+pH adjuster), pH=9.0

Furthermore, as shown in FIG. 10, the metal material is patterned by the photolithography and RIE, and lower electrode 9 is formed on contact plug 6.

When the flatness and smoothness (maximum roughness) of the upper surface of lower electrode 9 are evaluated by the AFM, the flatness is 10 nm or less, and the smoothness is 0.10 nm or less.

Furthermore, in order to improve the flatness and smoothness of the upper surface of lower electrode 9, the CMP of the metal material on contact plug 6 is first performed, and the upper surface of the metal material may then be smoothed by the gas cluster ion beam method before the patterning of the metal material.

For the smoothing by the gas cluster ion beam method, the CMP of the metal material on contact plug 6 does not have to be the CMP that uses the acid-slurry including colloidal silica. Moreover, the CMP of the metal material on contact plug 6 may be omitted.

Furthermore, as shown in FIG. 11, functional element 7 is formed immediately on the upper surface of contact plug 6 via lower electrode 9. Since this functional element 7 is formed on the upper surface of contact plug 6 that has been planarized as described above (on planarized lower electrode 9), integration of the semiconductor integrated circuit and performance of the functional element can be enhanced at the same time.

Finally, functional element 7 is covered with an insulating layer, and an interconnect connected to functional element 7 is formed, such that the basic structure shown in FIG. 2 is completed.

Thus, as a condition of the CMP for forming the contact plug, the acid-slurry including colloidal silica that has a small particle diameter is used, and the lower electrode is formed on the contact plug. Consequently, both the flatness and smoothness of the lower electrode serving as a foundation of the functional element can be sufficiently low.

In addition, the particle diameter of colloidal silica is preferably 100 nm or less as in the first embodiment.

If the smoothing by the gas cluster ion beam method is performed after or instead of the CMP of the metal material on the contact plug, the flatness and smoothness of the upper surface of the lower electrode can be further improved.

(4) Examination of Advantages

Advantages of the first to third embodiments are described in comparison with a comparative example.

Comparative Example

In the process according to the first embodiment, conditions of the CMP are, for example, as follows:

First CMP

Polishing pad: IC1000/S400 (manufactured by Rohm and Haas Corporation)

Slurry: alumina (0.5 wt %)+iron nitrate (1.0 wt %), pH=1.5

Second CMP (Touchup CMP)

Polishing pad: Politex (manufactured by Rohm and Haas Corporation)

Slurry: fumed silica (secondary particle diameter 500 nm)+ammonium persulfate (1.0 wt %+pH adjuster), pH=9.0

Fumed silica is silica of silica particles combined into a fumy state as shown in FIG. 14.

With regard to the comparative example, when the flatness and smoothness (maximum roughness) of the upper surface of contact plug 6 after touchup CMP are evaluated by the AFM, the flatness is about 50 nm or less, and the smoothness is about 1.2 nm or less.

As the primary particles of fumed silica agglomerate to form a huge secondary particle, the flatness and smoothness of the upper surface of the contact plug deteriorate. Moreover, if a contact plug is formed by CMP that uses an alkali-slurry, a recess in the upper surface of the contact plug increases.

Figure 12:
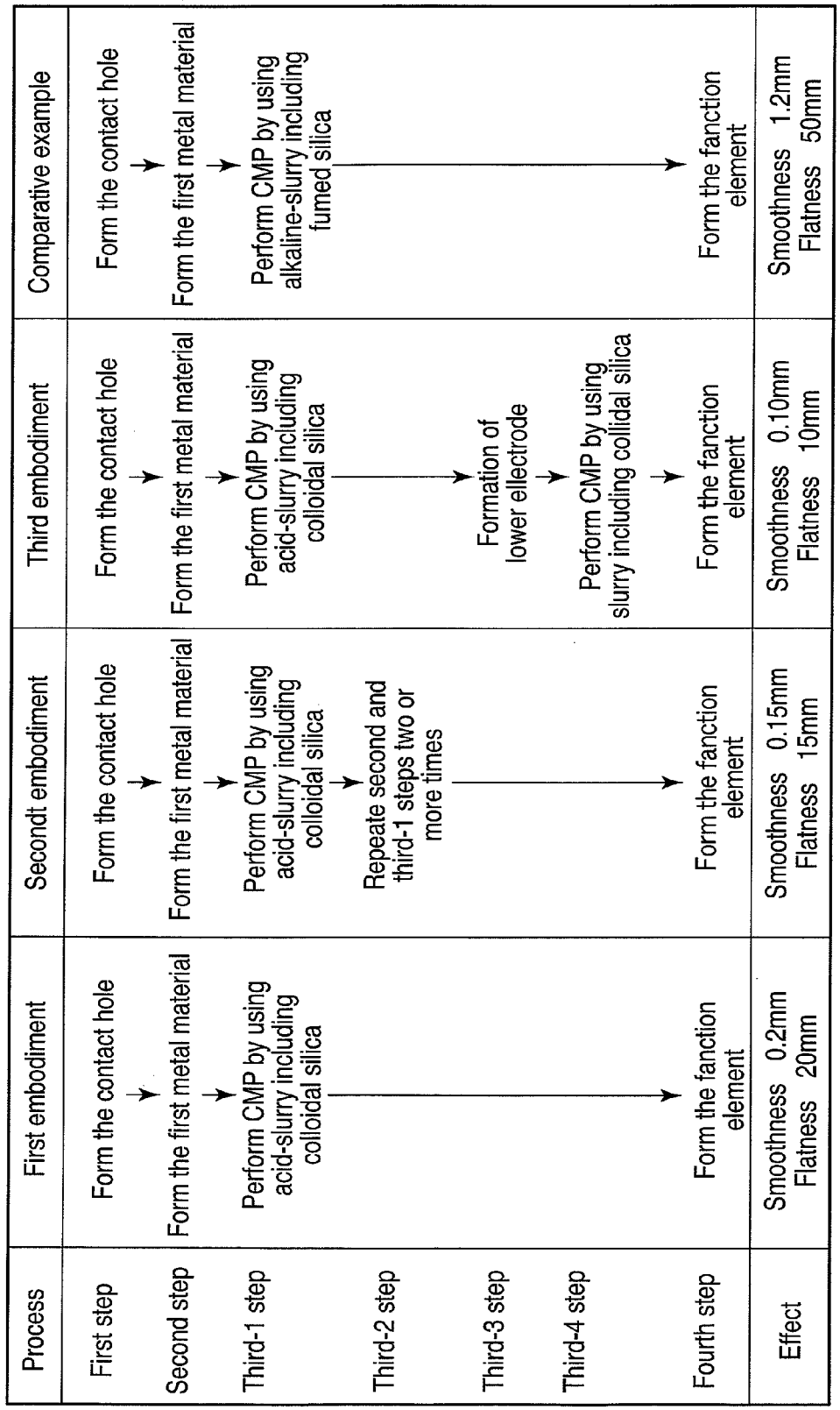
FIG. 12 shows a comparison of effects.

FIG. 12 shows advantages of the first to third embodiments and the comparative example.

A common characteristic of the first to third embodiments is that the contact plug is formed by the CMP using the acid-slurry including colloidal silica in the first substep of the third step. In contrast, in the comparative example, a contact plug is formed by the CMP using the alkali-slurry including fumed silica in the first substep of the third step.

Due to this difference, there is a great difference in the flatness and smoothness of the upper surface of the contact plug.

Figure 15:
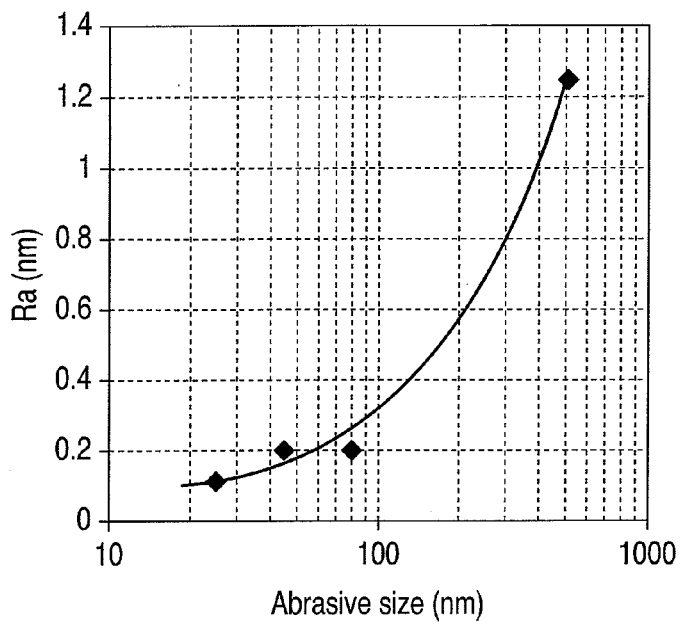
FIG. 15 shows a relationship between a grain size of abrasive and a smoothness.

FIG. 15 shows the relation between abrasive size and smoothness Ra of the upper surface of the contact plug.

Points indicate results of particle diameters of colloidal silica in the first to third embodiments and secondary particle diameters of fumed silica in the comparative example. It is obvious from such results that the smoothness Ra of the upper surface of the contact plug is 0.3 nm or less when the abrasive size is 100 nm or less.

In particular, according to the first to third embodiments, it is found out that the performance of the functional element can be enhanced when the smoothness Ra of the upper surface of the contact plug is 0.2 nm or less.

Thus, when the smoothness Ra of the upper surface of the contact plug is 0.2 nm or less, the flatness of the foundation of the functional element can be high, and part of the functional element (e.g., a ferromagnetic or antiferromagnetic layer of the magnetoresistive element) is not polished directly. Thus, characteristics of the functional element can be improved.

Moreover, as the functional element is disposed immediately on the upper surface (Ra 0.2 nm) of the contact plug, integration of the semiconductor integrated circuit and performance of the functional element can be enhanced at the same time.

Figure 16:
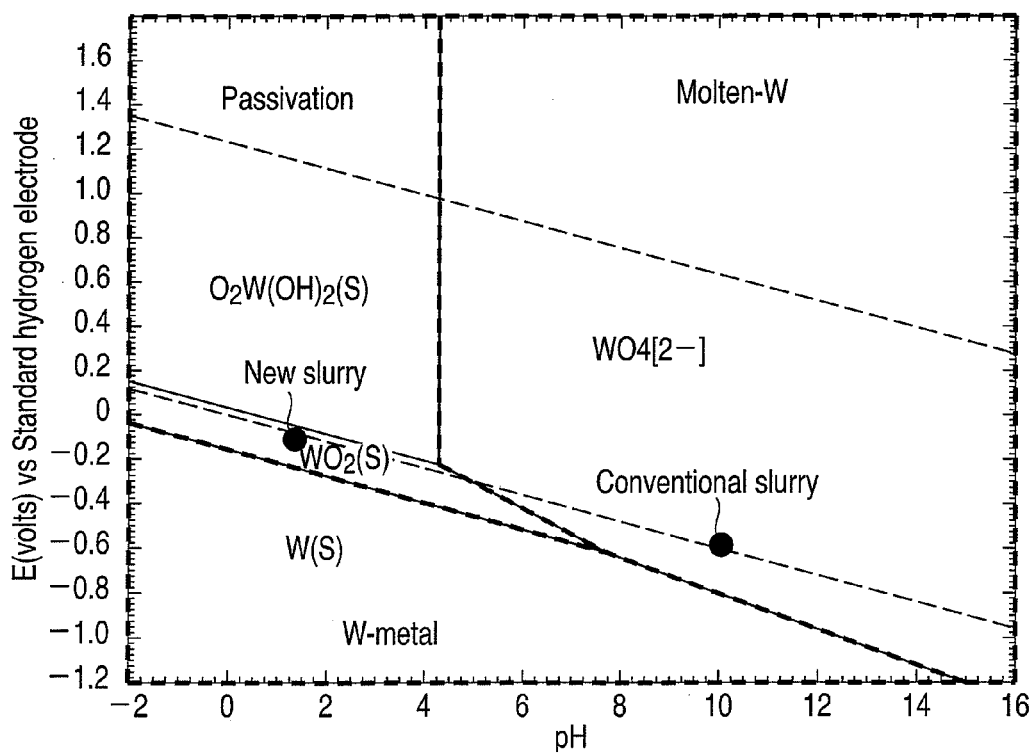
FIG. 16 shows a PH-potential diagram.

FIG. 16 shows a pH-potential (Pourbaix) diagram.

A new slurry is an acid-slurry including colloidal silica that is used for the touchup CMP in the first to third embodiments. A metal material (e.g., W) targeted for polishing is present in a stable passive region in the new slurry. Thus, the new slurry can suppress the melting (recess) of the metal material during the CMP.

Conversely, a conventional slurry is the alkali-slurry including fumed silica, and it is difficult for the conventional slurry to suppress the above-mentioned melting of the metal material.

In the meantime, the CMP allows for high smoothness of a material to be polished, but has a problem of scratches and residual abrasive grains, which may deteriorate the smoothness.

Therefore, as has been described in the first to third embodiments, if the gas cluster ion beam method is used together with or instead of the smoothing by the CMP, the flatness and smoothness of the upper surface of the contact plug or the upper surface of the lower electrode can be further improved.

The gas cluster ion beam method is disclosed in, for example, Patent document 3. According to the gas cluster ion beam method, an ion beam comprising a cluster (assembly) of atoms or molecules is generated and applied to the surface of a solid. At this moment, the cluster is decomposed, and the surface of the solid can be smoothed by a lateral sputtering effect.

A cluster ion beam apparatus comprises a cluster generator, an ionizer and an irradiator, and a vacuum is produced in the apparatus. The cluster is radiated from a nozzle, and ionized into cluster ions by an ion source. The ions are accelerated by applying an electric field thereto. Thus, the accelerated ions are applied to the surface of the solid, so that the surface of the solid is smoothed. Ion accelerating voltage is, for example, 3 to 60 keV. Ion surface density is, for example, $1 \times 10^{14}$ to $1 \times 10^{16}$ cm$^{-2}$.

The cluster is generated by, for example, discharging a high-pressure gas into the vacuum through a thin pipe constituting a nozzle. When the high-pressure gas is discharged into the vacuum, the high-pressure gas is cooled to a temperature less than or equal to a condensation temperature by adiabatic expansion, so that atoms or molecules are bonded together and a cluster is formed.

The cluster is ionized, for example, in the ion source by an electron collision method. According to this method, the cluster is charged by using the fact that electrons are ejected from the cluster when high-speed electrons collide with the cluster.

Elements that constitute the cluster include N, O, C, Ge, B, P, Si, Ge, Ar, He and NF$_3$. For example, N$_2$, Ar, O$_2$, CO$_2$, NF$_3$, B$_2$H$_6$, PH$_3$, AsH$_3$, SiH$_4$ or GeH$_4$ can be used as the material of the high-pressure gas. Among these materials of the high-pressure gas, CO$_2$ and NF$_3$ are highly effective in smoothing.

According to the cluster ion beam method, for example, the surface of a solid having a maximum roughness of 5 to 10 nm can be smoothed to a maximum roughness of 1 nm or less and further to a maximum roughness of 0.20 nm or less.

However, as has already been described, the cluster ion beam method is effective in smoothing a step of several tens of nanometers or less and is not suited to smoothing of a step greater than this size. Thus, the gas cluster ion beam method is preferably applied to the surface of a solid that has been smoothed to several tens of nanometers or less by, for example, the CMP.

3. Application Examples

The basic structure described above is particularly advantageously applied to a semiconductor device in which a functional element has a structure of stacked thin films. The reason is that the quality of a thinner film is more influenced by the foundation.

A typical example of such a semiconductor device is a magnetic random access memory.

Accordingly, application examples of the magnetic random access memory are described below.

(1) Magnetic Random Access Memory

The magnetic random access memory can be broadly classified into two types by writing methods. One type is a magnetic field writing type which uses a magnetic field to invert the magnetization of a magnetoresistive element. The other type is a spin transfer type which uses a spin torque originating from spin-polarized electrons to invert the magnetization of the magnetoresistive element.

One characteristic of the basic structure described above is in that the functional element is disposed immediately on the upper surface of the contact plug. Therefore, in particular, the basic structure described above is advantageously applied to the spin transfer type magnetic random access memory.

FIG. 17 shows an equivalent circuit of a memory cell of the magnetic random access memory.

The memory cell comprises a series connection of magnetoresistive element MTJ and switching element (e.g., an FET) T. One end of the series connection (one end of magnetoresistive element MTJ) is connected to first bit line BL1. The other end of the series connection (one end of switching element T) is connected to a second bit line BL2. A control terminal of switching element T, for example, a gate electrode of the FET is connected to a word line WL.

FIG. 18 shows a basic structure of a magnetoresistive element.

The magnetoresistive element has a stack structure comprising reference layer 11A having an invariable magnetization, storage layer 11C having a variable magnetization, and tunnel barrier layer 11B disposed therebetween.

In a bottom pin type, tunnel barrier layer 11B is disposed on reference layer 11A, and storage layer 11C is disposed on tunnel barrier layer 11B, when the magnetoresistive element is disposed on a semiconductor substrate. In a top pin type, tunnel barrier layer 11B is disposed on storage layer 11C, and reference layer 11A is disposed on tunnel barrier layer 11B.

The residual magnetizations of reference layer 11A and storage layer 11C may be in a directional level with a film plane (in-plane magnetization type), or may be in a directional perpendicular to the film plane (perpendicular magnetization type).

Here, the film plane corresponds to the upper surface and lower surface of reference layer 11A and storage layer 11C, and is equivalent to an interface between reference layer 11A and tunnel barrier layer 11B and an interface between storage layer 11C and tunnel barrier layer 11B.

The structure of the magnetoresistive element is not limited to such a structure. For example, each of reference layer 11A and storage layer 11C may have a multilevel structure, or there may be two or more tunnel barrier layers 11B.

Figure 19:
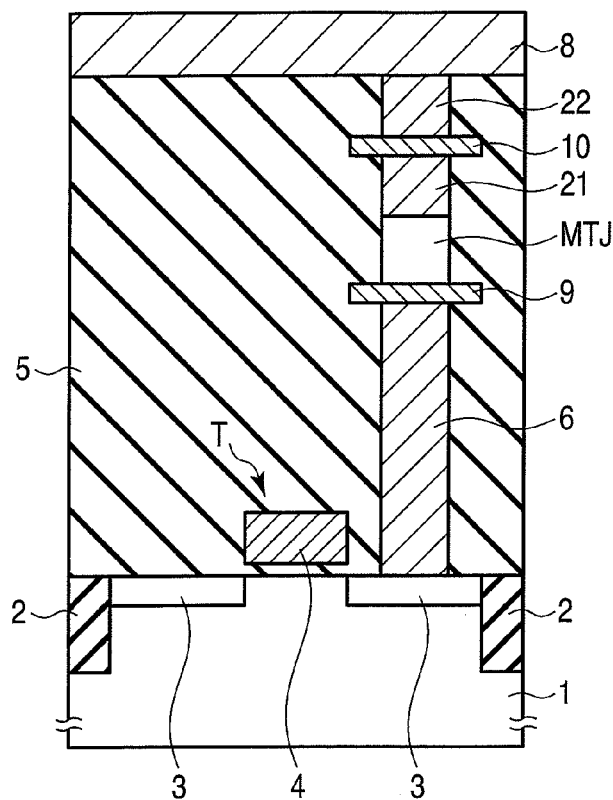
FIG. 19 shows a structure of the MRAM-cell.

FIG. 19 shows a structure of a memory cell of the magnetic random access memory.

Semiconductor substrate 1 is, for example, a silicon substrate, and its conductivity type may be either P or N. For example, a silicon oxide layer having an STI structure is disposed in semiconductor substrate 1 as element isolation insulating layer 2.

Switching element T is disposed in a surface region of semiconductor substrate 1, specifically, in an element region (active area) surrounded by element isolation insulating layer 2. In this example, switching element T is an FET, and includes two source/drain diffusion layers 3 in semiconductor substrate 1, and gate electrode 4 disposed on a channel region between the source/drain diffusion layers.

Switching element T is covered with insulating film (e.g., silicon oxide) 5. A contact hole is provided in insulating film 5. Contact plug 6 is disposed in the contact hole. Contact plug 6 comprises a metal material such as tungsten (W) or copper (Cu).

A lower surface of contact plug 6 is connected to the switching element. In this example, contact plug 6 is in direct contact with source/drain diffusion layer 3.

Figure 20:
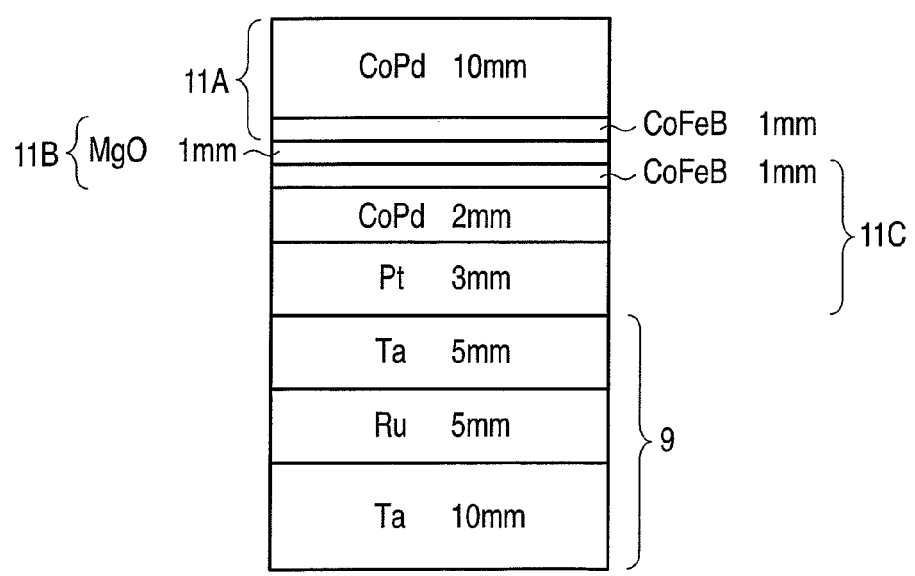
FIG. 20 shows a structure of a magnetoresistive element.

Lower electrode 9 is disposed on contact plug 6. Lower electrode 9 is formed by a stack structure comprising Ta (10 nm), Ru (5 nm) and Ta (5 nm), for example, as shown in FIG. 20.

Magnetoresistive element MTJ is disposed on lower electrode 9, that is, immediately on the upper surface of contact plug 6. Magnetoresistive element MTJ is formed by a stack structure comprising Pt (3 nm), CoPd (2 nm), CoFeB (1 nm), MgO (1 nm), CoFeB (1 nm) and CoPd (10 nm), for example, as shown in FIG. 20.

According to the third embodiment, a maximum roughness of the upper surface of contact plug 6 is 0.20 nm or less, and a maximum roughness of the upper surface of lower electrode 9 serving as a foundation of magnetoresistive element MTJ is 0.10 nm or less.

The thickness of the tunnel barrier layer (MgO) of magnetoresistive element MTJ is extremely small (1 nm). However, the upper surface of lower electrode 9 serving as a foundation of this layer is sufficiently planarized, so that the thickness of the tunnel barrier layer and the quality of the material constituting this layer can be uniform. As a result, there is no short circuit caused between reference layer 11A and storage layer 11C, and the magnetic property of magnetoresistive element MTJ can be improved.

Moreover, the smoothness (maximum roughness) of the upper surface of lower electrode 9 (upper surface of Ta [5 nm] in FIG. 20) is taken over by storage layer 11C (Pt/CoPd/CoFeB) thereon. Therefore, a homogeneous tunnel barrier layer (MgO) can be formed without directly polishing the surface of the ferromagnetic or antiferromagnetic layer. Consequently, there is no variation of the magnetic property of magnetoresistive element MTJ.

Furthermore, magnetoresistive element MTJ is disposed immediately on contact plug 6. Thus, for example, if writing is performed by a spin transfer type writing method, integration of the semiconductor integrated circuit can be enhanced by the size reduction of the memory cell.

Gap layer (e.g., Ta) 21 is disposed on magnetoresistive element MTJ. Moreover, upper electrode (e.g., TiN) 10 is disposed on gap layer 21.

Upper electrode 10 is connected to interconnect (e.g., Cu) 8 through via (e.g., Cu) 22. Interconnect 8 corresponds to first bit line BL1 in FIG. 17.

FIG. 21 shows details of the magnetic random access memory.

In a memory cell array, magnetoresistive element MTJ is disposed between contact plug 6 and upper electrode UE. Switching element T is an FET. Magnetoresistive element MTJ is not disposed in a peripheral circuit.

In this example, there are four metal interconnect layers M1 to M4, and metal interconnect layers M1 to M4 are connected to one another by vias V1 to V4. BL1 and BL2 correspond to bit lines BL1 and BL2 in FIG. 17.

Consequently, according to the magnetic random access memory to which the basic structure described above is applied, integration of the semiconductor integrated circuit and performance of the functional element can be enhanced at the same time by the reduction of the memory cell.

(2) With Regard to Foundation of Functional Element

The foundation of the functional element (e.g., magnetoresistive element) preferably comprises a material with a compressive stress.

This is attributed to the following fact: When the foundation comprises a material with a tensile stress, the characteristics of the functional element (e.g., the magnetic property as to the magnetoresistive element) easily deteriorate even if the foundation is smoothed by, for example, the method shown in the first to third embodiments.

Thus, when the foundation comprises a material with a tensile stress, a material with a compressive stress is stacked thereon, and the functional element is formed on the material with a compressive stress.

One such example is described below.

In a semiconductor device shown in FIG. 22 and FIG. 23, contact plug 6 comprises tungsten (W), and lower electrode 9 comprises tantalum (Ta). Functional element 7 is disposed on lower electrode 9. Tantalum is one of the materials with a compressive stress. FIG. 22 shows an example in which functional element 7 is disposed immediately on contact plug 6.

FIG. 23 shows an example in which functional element 7 is disposed in a region which is not immediately on contact plug 6. In a semiconductor device shown in FIG. 24 and FIG. 25, contact plug 6 comprises tungsten (W), and lower electrodes 9A and 9B comprise a stack of copper (Cu) and tantalum (Ta). Lower electrode 9B (Ta) is formed on lower electrode 9A (Cu). Functional element 7 is disposed on lower electrode 9B. Tantalum is one of the materials with a compressive stress.

Figure 24:
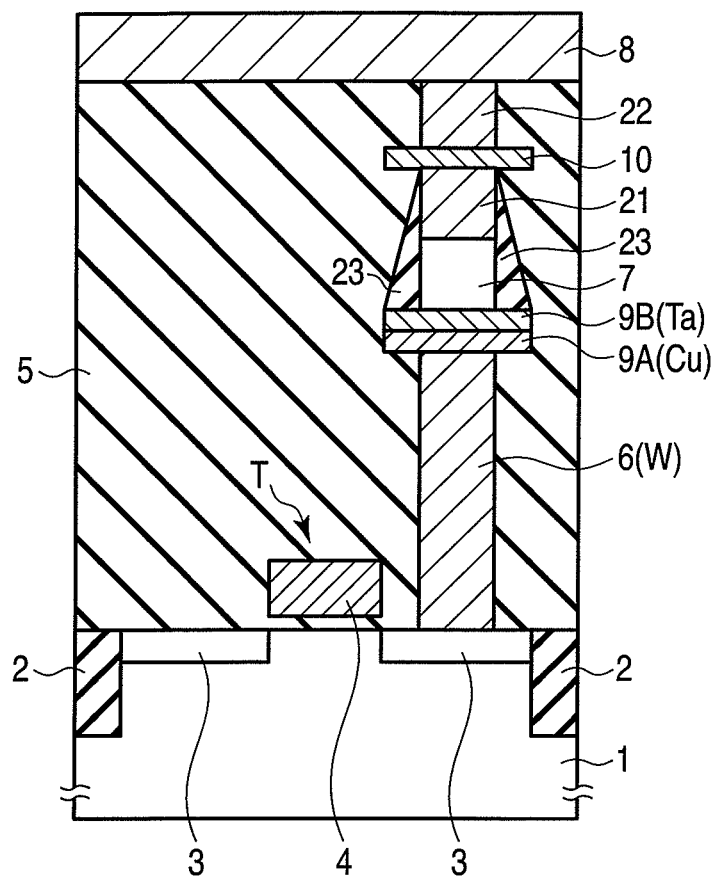

A sidewall of functional element 7 is covered with sidewall insulating film 23 comprising one or more layers. FIG. 24 shows an example in which functional element 7 is disposed immediately on contact plug 6. FIG. 25 shows an example in which functional element 7 is disposed in a region which is not immediately on contact plug 6.

(3) Addition

In FIGS. 19 and 21, the magnetoresistive element MTJ may comprise a perpendicular magnetization film which has a magnetization in a perpendicular direction to a film surface, and may comprise an in-plane magnetization film which has a magnetization in an in-plane direction to the film surface.

As shown in FIG. 26, the reference layer 11A may comprise first and second ferromagnetic layers 12, 13 and a nonmagnetic layer 14 therebetween. In this case, magnetization directions of the first and second ferromagnetic layers 12, 13 are reversed each other. The first ferromagnetic layer 12 is called a shift adjustment layer, and has a function which adjusts an offset of magnetization reversal characteristic of the storage layer 11C. The offset is caused by a leak-magnetic field from the reference layer 11A. The leak-magnetic field depends on a shape of the reference layer 11A after a patterning of the magnetoresistive element.

In this example, a boundary layer 15 is provided between the reference layer 11A and the tunnel barrier layer 11B, and a boundary layer 16 is provided between the storage layer 11C and the tunnel barrier layer 11B. These boundary layers 15, 16 may be omitted.

Magnetoresistive element MTJ in FIG. 19 and FIG. 21 can be replaced with a functional element such as a variable resistive element (metal oxide), phase change element, diode, resistive element or capacity element.

For example, if magnetoresistive element MTJ is replaced with the variable resistive element (metal oxide), this element serves as a resistance change memory. If magnetoresistive element MTJ is replaced with the phase change element, this element serves as a phase change memory.

4. Conclusion

According to the embodiments, integration of the semiconductor integrated circuit and performance of the functional element can be enhanced at the same time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
   forming a contact plug by
   forming a first metal material; and
   polishing the first metal material by a first CMP-process and a second CMP-process until a roughness of an upper surface of the contact plug becomes 0.2 nm or less, and
   wherein the second CMP-process is executed by using an acid-slurry comprising a colloidal silica, and
   the colloidal silica comprises silica particles.

2. The method of claim 1,
   wherein the forming the contact plug is repeated twice or more.

3. The method of claim 1, further comprising:
   forming a functional element on a lower electrode after forming the lower electrode on the contact plug,
   wherein the forming the lower electrode comprises polishing a second metal material by the second CMP-process after forming the second metal material on the contact plug.

4. The method of claim 1, further comprising:
   forming a functional element on a lower electrode after forming the lower electrode on the contact plug,
   wherein the forming the lower electrode comprises smoothing a second metal material by a gas cluster ion beam method after forming the second metal material on the contact plug.

5. The method of claim 1,
   wherein a diameter of each of the silica particles is 100 nm or less.

6. The method of claim 2,
   wherein a diameter of each of the silica particles is 100 nm or less.

7. The method of claim 3,
   wherein a diameter of each of the silica particles is 100 nm or less.

8. The method of claim 4,
   wherein a diameter of each of the silica particles is 100 nm or less.

* * * * *